United States Patent [19]

Smolley

[11] Patent Number: 4,733,172
[45] Date of Patent: Mar. 22, 1988

[54] APPARATUS FOR TESTING I.C. CHIP

[75] Inventor: Robert Smolley, Porteuguese Bend, Calif.

[73] Assignee: TRW Inc., Redondo Beach, Calif.

[21] Appl. No.: 941,907

[22] Filed: Dec. 15, 1986

Related U.S. Application Data

[63] Continuation-in-part of Ser. No. 835,818, Mar. 8, 1986.

[51] Int. Cl.$^4$ ............................................. G01R 31/02
[52] U.S. Cl. ............................ 324/158 P; 324/158 F; 324/73 PC
[58] Field of Search ........... 324/158 F, 158 P, 73 PC, 324/72.5; 361/395, 393

[56] References Cited

U.S. PATENT DOCUMENTS

| | | | |
|---|---|---|---|
| 3,866,119 | 2/1975 | Ardezzone et al. | 324/158 F |
| 4,056,773 | 11/1977 | Sullivan | 324/73 PC |
| 4,563,640 | 1/1986 | Hasegawa | 324/158 P |
| 4,574,331 | 3/1986 | Smolley | 361/395 |

Primary Examiner—Reinhard J. Eisenzopf
Assistant Examiner—Vinh P. Nguyen
Attorney, Agent, or Firm—James M. Steinberger; Sol L. Goldstein; Robert J. Stern

[57] ABSTRACT

An improved test probe card for testing unpackaged integrated-circuit (IC) chips prior to installation of the chips in some type of electronic device. The test probe card includes a chip insulating board having openings at positions corresponding to contact areas of an IC chip and a test circuit board having inner contact areas at positions corresponding to the openings in the chip insulating board. Electrical connections between the IC chip and inner circuit board contact areas are established with conductive connector elements positioned in the openings. Circuit board traces electrically connect the inner circuit board contact areas with outer contact areas located about the periphery of the circuit board. The outer contact areas are preferably connected to a testing device using coaxial cables, which are electrically connected to the outer contact areas with a coaxial cable connecting board. The connector elements are preferably each formed from a single strand of metal wire, each strand being wadded together to form a nearly cylindrical "button" of material.

15 Claims, 3 Drawing Figures

U.S. Patent    Mar. 22, 1988    4,733,172
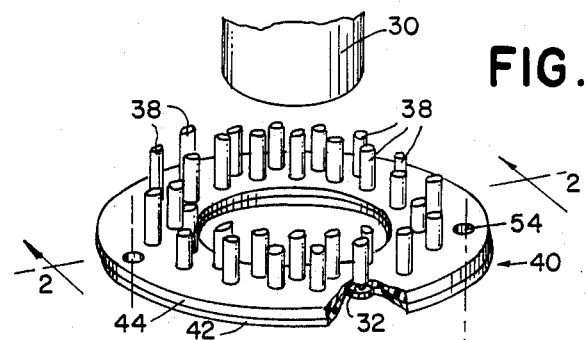
FIG. 1
FIG. 3
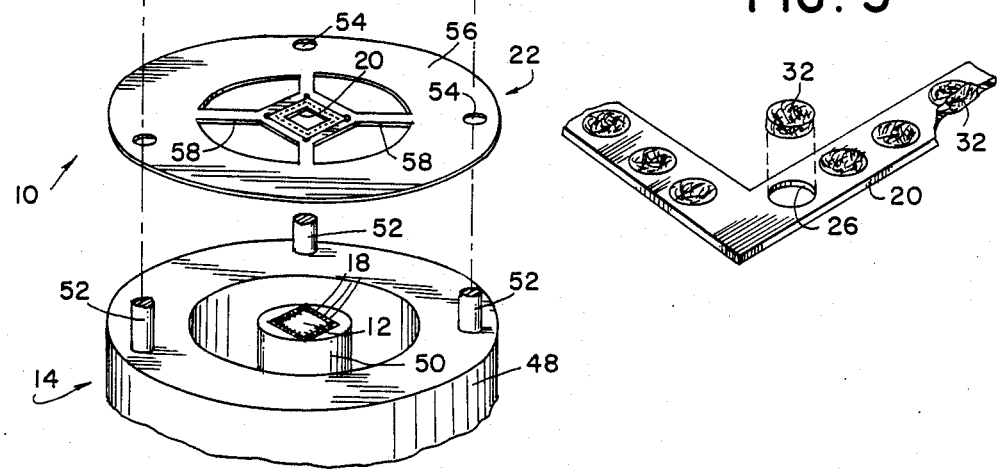
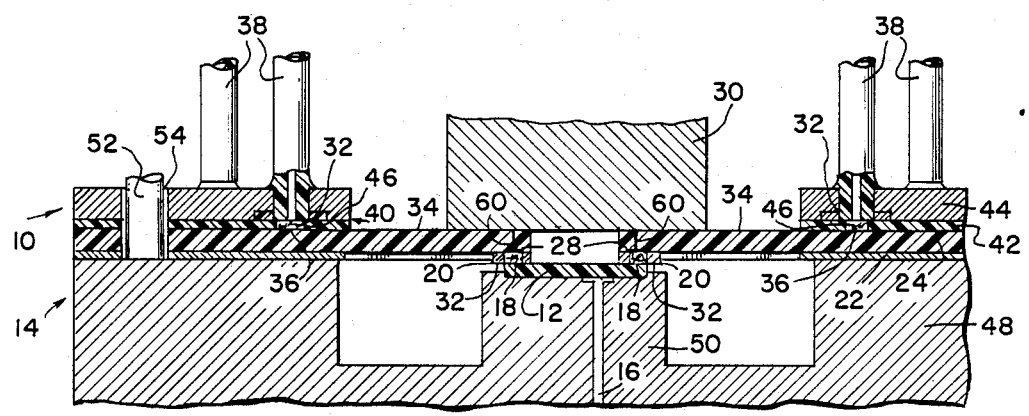
FIG. 2

APPARATUS FOR TESTING I.C. CHIP

This application is a continuation-in-part of a copending application by the same inventor entitled "Integrated-Circuit Chip Interconnection System," Ser. No. 835,818, and filed on Mar. 8, 1986.

This application is related to an earlier filed application by the same inventor entitled "Multi-Element Circuit Construction," Ser. No. 499,136, filed on May 31, 1983, which issued as U.S. Pat. No. 4,574,331 on Mar. 3, 1986 and U.S. Pat. No. 4,581,679 on Apr. 8, 1986. This application is also related to an earlier filed application by the same inventor entitled "Multilayer Circuit Board Interconnection," Ser. No. 482,372, filed on Aug. 25, 1965, and subsequently abandoned.

BACKGROUND OF THE INVENTION

This invention relates generally to devices for testing electronic components and, more particularly, to devices for testing microelectronic components, including integrated-circuit (IC) chips.

An integrated-circuit (IC) chip generally contains thousands of microscopic circuit elements, such as transistors, resistors and capacitors. These circuit elements are interconnected within the IC chip in a variety of circuit configurations, with input/output leads of the various circuits connected to conductive areas or pads located about the periphery of the IC chip. To ensure that the various circuits in each IC chip are functioning properly, so that each IC chip can be used reliably in some type of electronic device, it is desirable that each IC chip be tested prior to being installed in the electronic device. Furthermore, because packaging an IC chip is relatively costly and time consuming, and because a significant number of IC chips fail the testing process and have to be discarded, it is also desirable that each IC chip be tested prior to being placed in its chip package.

An unpackaged IC chip, having no pins or leads, can be electrically connected to an IC chip testing device by means of a test probe card. A conventional test probe card is disclosed in U.S. Pat. No. 3,835,381 to Garretson et al. The Garretson et al. test probe card comprises a probe assembly mounted in an aperture located at one end of a test circuit board. The probe assembly, a radial array of inwardly-projecting, electrically-conductive probe wires, makes electrical contact with the contact areas about the periphery of the unpackaged IC chip. Each probe wire is fabricated from a tungsten wire, with the contact portion of each probe wire being tapered and bent at right angles to the axis of the probe assembly for contact with a chip contact area. Circuit board traces electrically connect the probe wires with an edge card connector at the other end of the test circuit board. The edge card connector electrically connects the test circuit board to a chip testing device.

Although the Garretson et al. test probe card has many advantages, it does have certain disadvantages. One disadvantage is that the test probe card is rather costly to manufacture and has a limited useful life. Another disadvantage is that the test probe assembly is extremely delicate, with the probe wires being easily bent and requiring constant realignment. Finally, another disadvantage is that because of the ever increasing speed of IC chips, the parasitic capacitances of the probe wires and long circuit board traces can severely limit the high speed testing of IC chips. To obviate or minimize the disadvantages arising from the use of conventional test probe cards, it is apparent that a new approach for testing unpackaged IC chips is needed. The new approach should be less costly to manufacture and have a longer useful life. The new approach should also minimize contact resistance and probe alignment difficulties and, most importantly, the new approach should minimize parasitic capacitance. The present invention is directed to these ends.

SUMMARY OF THE INVENTION

The present invention resides in an improved test probe card for testing unpackaged IC chips. Briefly, and in general terms, the improved test probe card includes a chip insulating board and a test circuit board. The chip insulating board has openings at positions corresponding to contact areas of an unpackaged IC chip and the test circuit board has inner contact areas at positions corresponding to the openings in the chip insulating board. Electrical connections between the IC chip and inner circuit board contact areas are established with conductive connector elements positioned in the openings. Circuit board traces electrically connect the inner circuit board contact areas with outer contact areas located about the periphery of the circuit board. The outer contact areas are preferably connected to a testing device using coaxial cables, which are electrically connected to the outer contact areas with a coaxial cable connecting board.

In a presently preferred embodiment of the invention, an IC chip is mounted in a recessed area of a test stand. The exposed top face of the IC chip has a plurality of metalized contact areas or pads located about the periphery of the chip, which are connected to the input/output leads of the various circuits in the IC chip. A chip insulating board, attached to the inner portion of a flexible support frame, is interposed between the IC chip and a test circuit board. The chip insulating board has openings at positions corresponding to the IC chip contact areas and the test circuit board has inner contact areas at positions corresponding to the openings in the chip insulating board. Electrical connections between the IC chip contact areas and the inner circuit board contact areas are established by compressing the test circuit board toward the IC chip with a weight, thus compressing connector elements positioned in the openings of the chip insulating board against the chip and inner circuit board contact areas.

Circuit board traces electrically connect the inner circuit board contact areas with outer circuit board contact areas located about the periphery of the circuit board. The outer contact areas are preferably connected to a testing device using coaxial cables, which are electrically connected to the outer contact areas with a coaxial cable connecting board. The coaxial cable connecting board includes a coaxial cable insulating board and a coaxial cable support frame. The coaxial cable insulating board has openings at positions corresponding to the outer circuit board contact areas and the coaxial cable support frame supports the coaxial cables at positions corresponding to the openings in the coaxial cable insulating board. Electrical connections between the outer contact areas and the ends of the coaxial cables are established by compressing the coaxial cable support frame toward the test circuit board, thus compressing connector elements positioned in the openings of the insulating board against the outer circuit board contact areas and the coaxial cable ends.

The connector elements are preferably each formed from a single strand of metal wire, each strand being wadded together to form a nearly cylindrical "button" of material. Each wadded-wire connector element fits snugly in an opening of the chip or coaxial cable insulating board and protrudes slightly above and below the insulating board. The wadded-wire connector elements make electrical contact at multiple points when compressed against a contact area. Connectors of this type have significant advantages over other types of connectors, and provide connections of high integrity and reliability. In contrast to other types of connectors, this mechanical connector element has very few associated variables that can effect the quality of the connection. The only significant variables are the size of the connector element and the compressive force used to make the connection, both of which can be accurately controlled.

It will be appreciated from the foregoing that the present invention represents a significant advance in the art of testing microelectronic components. The improved test probe card of the present invention is relatively inexpensive to manufacture and has a long useful life. In addition, the parasitic capacitance of the improved test probe card is substantially reduced because probe wires and long circuit board traces are eliminated. Furthermore, the wadded-wire connector elements have very little contact resistance and present no alignment problems. Other features and advantages of the present invention will become apparent from the following more detailed description, taken in conjunction with the accompanying drawings, which illustrate, by way of example, the principles of the invention.

BRIEF DESCRIPTION OF THE DRAWINGS

FIG. 1 is a fragmentary perspective view of an improved test probe card utilizing the technique of the present invention;

FIG. 2 is a fragmentary sectional view of the improved test probe card utilizing the technique of the present invention; and FIG. 3 is a fragmentary, exploded perspective view of a chip insulating board having a plurality of wadded-wire connector elements.

DESCRIPTION OF THE PREFERRED EMBODIMENT

As shown in the drawings for purposes of illustration, the present invention is embodied in a test probe card for testing unpackaged IC chips. An IC chip generally contains thousands of microscopic circuit elements interconnected within the IC chip in a variety of circuit configurations. To ensure that the various circuits in each IC chip are functioning properly, so that each IC chip can be used reliably in some type of electronic device, it is desirable that each IC chip be tested prior to being installed in the electronic device. Furthermore, because packaging an IC chip is relatively costly and time consuming, and because a significant number of IC chips fail the testing process and have to be discarded, it is also desirable that each IC chip be tested prior to being placed in its chip package. Conventional test probe cards of the prior art, which allow an unpackaged IC chip to be connected to a testing device, do not provide adequate performance for testing an IC chip at high speed.

In accordance with the present invention, the improved test probe card includes a chip insulating board and a test circuit board. The chip insulating board has openings at positions corresponding to contact areas of an unpackaged IC chip and the test circuit board has inner contact areas at positions corresponding to the openings in the chip insulating board. Electrical connections between the IC chip and inner circuit board contact areas are established with conductive connector elements positioned in the openings. Circuit board traces electrically connect the inner circuit board contact areas with outer contact areas located about the periphery of the circuit board. The outer contact areas are preferably connected to a testing device using coaxial cables, which are electrically connected to the outer contact areas with a coaxial cable connecting board.

FIGS. 1 and 2 illustrate an improved IC chip test probe cardd 10 for testing an unpackaged IC chip 12. The IC chip 12 is mounted in a recessed area of a test stand 14 and held firmly in place by a vacuum line 16. The exposed top face of the IC chip 12 has a plurality of thin-film metalization contact areas or pads 18 located about the periphery of the chip 12, which are connected to the input/output leads of the various circuits in the IC chip 12. A chip insulating board 20, attached to the inner portion of a flexible support frame 22, is interposed between the IC chip 12 and a test circuit board 24. The chip insulating board 20, as shown more clearly in FIG. 3, has openings 26 at positions corresponding to the IC chip contact areas 18. The lower surface of the test circuit board 24 has inner contact areas 28 at positions corresponding to the openings 26 in the chip insulating board 20. Electrical connections between the IC chip contact areas 18 and the inner circuit board contact areas 28 are established by compressing the test circuit board 24 toward the IC chip 12 with a weight 30, thus compressing connector elements 32 positioned in the openings 26 of the chip insulating board 20 against the chip contact areas 18 and the inner circuit board contact areas 28.

Circuit board traces 34 on the upper surface of the test circuit board 24 electrically connect the inner circuit board contact areas 28 with outer circuit board contact areas 36 located about the periphery of the circuit board 24. The outer contact areas 36 are preferably connected to a testing device (not shown) using coaxial cables 38, which are electrically connected to the outer contact areas 36 with a coaxial cable connecting board 40. The coaxial cable connecting board 40 includes a coaxial cable insulating board 42 and a coaxial cable support frame 44. The coaxial cable insulating board 42 has openings 46 at positions corresponding to the outer circuit board contact areas 36 and the coaxial cable support frame 44 supports the coaxial cables 38 at positions corresponding to the openings 46 in the coaxial cable insulating board 42. Electrical connections between the outer contact areas 36 and the ends of the coaxial cables 38 are established by compressing the coaxial cable support frame 44 toward the test circuit board 24, thus compressing connector elements 32 positioned in the openings 46 of the insulating board 42 against the outer circuit board contact areas 36 and the ends of the coaxial cables 38.

In a presently preferred embodiment of the invention, the connector elements 32 are each formed from a single strand of metal wire wadded together to form a nearly cylindrical "button" of material having a density of between twenty and thirty percent. Each wadded-wire connector element 32 fits snugly in an opening 26 of the chip insulating board 20 or an opening 46 of the coaxial cable insulating board 44 and protrudes slightly above and below the insulating board. The wadded-wire connector elements 32 make electrical contact at multiple points when compressed against a contact area. Connectors of this type have significant advantages over other types of connectors, and provide connections of high integrity and reliability. In contrast to other types of connectors, this mechanical connector element has very few associated variables that can affect the quality of the connection. The only significant variables are the size of the element and the compressive force used to make the connection, both of which can be accurately controlled.

The top of the test stand 14 has an outer, annular portion 48 for supporting the test probe card 10 and a center portion 50 for mounting the IC chip 12. The outer, annular portion 48 is slightly higher than the center portion 50 so that electrical contact between the test probe card 10 and the IC chip 12 is made only after the weight 30 is placed on the test probe card 10. The outer, annular portion 48 has vertical posts 52 that engage holes 54 in the test probe card 10 to firmly hold the test probe card 10 in place during the testing process.

The flexible support frame 22 is an annular disk 56 with a plurality of ribs 58 extending into the center portion of the disk 56 to flexibly support the chip insulating board 20. The support frame 22 is preferably fabricated from stainless steel having a thickness of about 0.001 to 0.002 inches. The flexibility of the support frame 22 allows the chip insulating board 20 to make electrical contact with the IC chip 12 when the weight 30 is placed on the test probe card 10.

The test circuit board 24 is a conventional circuit board, circular in shape, with electrically-conductive traces 34 on at least one surface of the circuit board extending from the inner circuit board contact areas 28 to the outer circuit board contact areas 36. As shown in FIG. 2, the inner contact areas 28 on the lower surface of the circuit board 24, which make electrical contact with the wadded-wire connector elements 32, are electrically connected by plated via holes 60 to the circuit board traces 34 on the upper surface of the circuit board 24. The circuit board traces 34 are about two inches long, compared to the approximately 12 to 14 inch long circuit traces of conventional test probe cards, thus substantially reducing parasitic capacitance of the test probe card 10.

The coaxial cable connecting board 40 is annular in shape to allow the weight 30 to rest directly on the test circuit board 24. The outer conductors of the coaxial cables 38 are grounded to the coaxial cable support frame 46 and the inner conductors of the coaxial cables 38 terminate in flat contact areas for electrically connecting the inner conductors to the connector elements 32.

The coaxial cable insulating board 42 and the chip insulating board 20 are preferably fabricated from an insulating material, such as a glass ceramic. The wadded-wire connector elements 32 are preferably made with wire fabricated from nickel or alloys of beryllium and copper, silver and copper, or phosphorous and bronze. Each wadded-wire connector element 32, when under compression, makes multiple contacts with a contact area, and provides multiple conductive paths. In addition, each contact made by the wadded-wire connector element 32 is at very high pressure, because of the type of spring formed by the wadded wire and the small area of each contact point. The compression of the wadded-wire connector elements 32 is substantially elastic so that, when the compressive force of the weight 30 is removed, the wadded-wire connector elements 32 return to their original shape, thus providing the test probe card with its long useful life. In the embodiment described, the wadded-wire connector elements 32 are manufactured by Technical Wire Products, Inc. of Piscataway, N.J., under the trademark Fuzz Button.

From the foregoing, it will be appreciated that the present invention represents a significant advance in the art of testing microelectronic components. The improved test probe card of the present invention is relatively inexpensive to manufacture and has a long useful life. In addition, the parasitic capacitance of the improved test probe card is substantially reduced because probe wires and long circuit board traces are eliminated. Furthermore, the wadded-wire connector elements have very little contact resistance and present no alignment problems. Although a preferred embodiment of the invention has been shown and described, it will be apparent that other adaptations and modifications can be made without departing from the spirit and scope of the invention. Accordingly, the invention is not to be limited, except as by the following claims.

I claim:

1. Apparatus for testing an IC chip, the IC chip having a plurality of contact areas, comprising:
   a chip insulating board having a plurality of openings therethrough, with at least some of the openings at positions corresponding to the IC chip contact areas;
   a test circuit board having inner contact areas at positions corresponding to some of the openings in the chip insulating board and a plurality of electrically-conductive traces on at least one side of the test circuit board electrically connecting the inner contact areas with a plurality of outer contact areas located about the periphery of the test circuit board;
   a plurality of conductive connector elements disposed in selected ones of the openings in the chip insulating board for making electrical connections between the chip and inner contact areas; and
   means for electrically connecting the outer contact areas to a testing device.

2. The apparatus as set forth in claim 1, wherein each of the connector elements includes a wadded strand of conductive wire that is deformed when compressed and makes multiple electrical contacts with the chip and inner contact areas.

3. The apparatus as set forth in claim 1, wherein the means for electrically connecting the outer contact areas to a testing device includes a coaxial cable connecting board for connecting the outer contact areas to the testing device using coaxial cables.

4. The apparatus as set forth in claim 3, wherein the coaxial cable connecting board includes:
   a coaxial cable insulating board having a plurality of openings therethrough, with at least some of the openings at positions corresponding to the outer contact areas;
   a coaxial cable support frame for supporting the coaxial cables at positions corresponding to some of the openings in the coaxial cable insulating board; and
   a plurality of conductive connector elements disposed in selected ones of the openings in the coaxial cable insulating board for making electrical connections between the outer contact areas and the ends of the coaxial cables.

5. The apparatus as set forth in claim 4, wherein each of the connector elements includes a wadded strand of conductive wire that is deformed when compressed and makes multiple electrical contacts with the outer contact areas and the ends of the coaxial cables.

6. The apparatus as set forth in claim 1, wherein the chip insulating board is attached to an inner portion of a flexible support frame.

7. The apparatus as set forth in claim 6, wherein the flexible support frame is an annular disk having a plurality of ribs extending into the center portion of the disk to flexibly support the chip insulating board.

8. The apparatus as set forth in claim 1, and further including a test stand having an outer, annular portion for supporting the chip insulating board and test circuit board. and a center portion for mounting the IC chip.

9. The apparatus as set forth in claim 1, and further including means for compressing the test circuit board toward the IC chip, thereby compressing the connector elements and making electrical contact between the chip and inner contact areas.

10. Apparatus for testing an IC chip having a plurality of contact areas, comprising:
 a chip insulating board having a plurality of openings therethrough, with at least some of the openings at positions corresponding to the IC chip contact areas;
 a test circuit board having inner contact areas at positions corresponding to some of the openings in the chip insulating board and a plurality of electrically-conductive traces on at least one side of the test circuit board electrically connecting the inner contact areas with a plurality of outer contact areas located about the periphery of the test circuit board;
 a plurality of conductive connector elements disposed in selected ones of the openings in the chip insulating board for making electrical connections between the chip and inner circuit board contact areas;
 a coaxial cable insulating board having a plurality of openings therethrough, with at least some of the openings at positions corresponding to the outer contact areas;
 a coaxial cable support frame for supporting coaxial cables at positions corresponding to some of the openings in the coaxial cable insulating board; and
 a plurality of conductive connector elements disposed in selected ones of the openings in the coaxial cable insulating board for making electrical connections between the outer contact areas and the ends of the coaxial cables.

11. The apparatus as set forth in claim 10, wherein each of the connector elements includes a wadded strand of conductive wire that is deformed when compressed and makes multiple electrical contacts with the chip and inner contact areas or with the outer contact areas and the ends of the coaxial cables.

12. The apparatus as set forth in claim 10, wherein the chip insulating board is attached to an inner portion of a flexible support frame.

13. The apparatus as set forth in claim 12, wherein the flexible support frame is an annular disk having a plurality of ribs extending into the center portion of the disk to flexibly support the chip insulating board.

14. The apparatus as set forth in claim 10, and further including a test stand having an outer, annular portion for supporting the chip insulating board, the test circuit board and the coaxial cable insulating board and a center portion for mounting the IC chip.

15. The apparatus as set forth in claim 10, and further including means for compressing the test circuit board toward the IC chip, thereby compressing the connector elements and making electrical contact between the chip and inner contact areas.

* * * * *